United States Patent [19]
Van Klooster

[11] Patent Number: 5,166,601
[45] Date of Patent: Nov. 24, 1992

[54] TEST DEVICE FOR ELECTRIC CIRCUITS ON BOARDS

[75] Inventor: Robert K. A. Van Klooster, Hoorn, Netherlands

[73] Assignee: U.S. Philips Corp., New York, N.Y.

[21] Appl. No.: 651,685

[22] Filed: Feb. 6, 1991

[30] Foreign Application Priority Data

Jun. 28, 1990 [NL] Netherlands ............. 9001478

[51] Int. Cl.$^5$ ............................................. G01R 31/02
[52] U.S. Cl. .................................................. 324/158 F
[58] Field of Search ................ 324/158 F, 158 P, 725; 439/482, 842

[56] References Cited

U.S. PATENT DOCUMENTS

| | | | |
|---|---|---|---|
| 4,115,735 | 9/1978 | Stanford | 324/158 P |
| 4,321,533 | 3/1982 | Matrone | 324/158 P |
| 4,344,033 | 8/1982 | Stowers et al. | 324/158 F |
| 4,625,164 | 11/1986 | Golder et al. | 324/158 F |
| 4,626,776 | 12/1986 | Wilkinson | 324/158 F |
| 4,626,779 | 12/1986 | Boyle | 324/158 F |
| 4,636,723 | 1/1987 | Coffin | 324/158 F |
| 4,667,155 | 5/1987 | Coiner et al. | 324/158 F |
| 4,746,861 | 5/1988 | Nesbitt | 324/158 F |
| 4,841,231 | 6/1989 | Angelucci | 324/158 F |

FOREIGN PATENT DOCUMENTS 2178860 2/1987 United Kingdom .

Primary Examiner—Vinh Nguyen
Attorney, Agent, or Firm—Ernestine C. Bartlett

[57] ABSTRACT

A device for testing an electric circuit or components of this circuit provided on a board (9), which board (9) is secured against a support (7) by an underpressure in a first chamber (15) during operation. An electrical connection is effected between the board (9) and an electronic test unit (69) of the device by means of a contact plate (81). The contact plate (81) is provided exchangeably on a partition wall (13) which hermetically seals off the first chamber (15) from a second chamber (17) and which can be moved in a direction transverse to the board (9) by a pressure difference between the two chambers (15, 17). The exchangeable contact plate (81) corresponds to the type of board (9) and activates a combination of test probes (49) from a set of test probes (49) provided in a matrix plate (45), which combination is unique for the type of board (9), after the partition wall (13) has been moved. In this way a functional test of the entire circuit on the board (9) and/or or a component test can be carried out by means of the device.

21 Claims, 4 Drawing Sheets

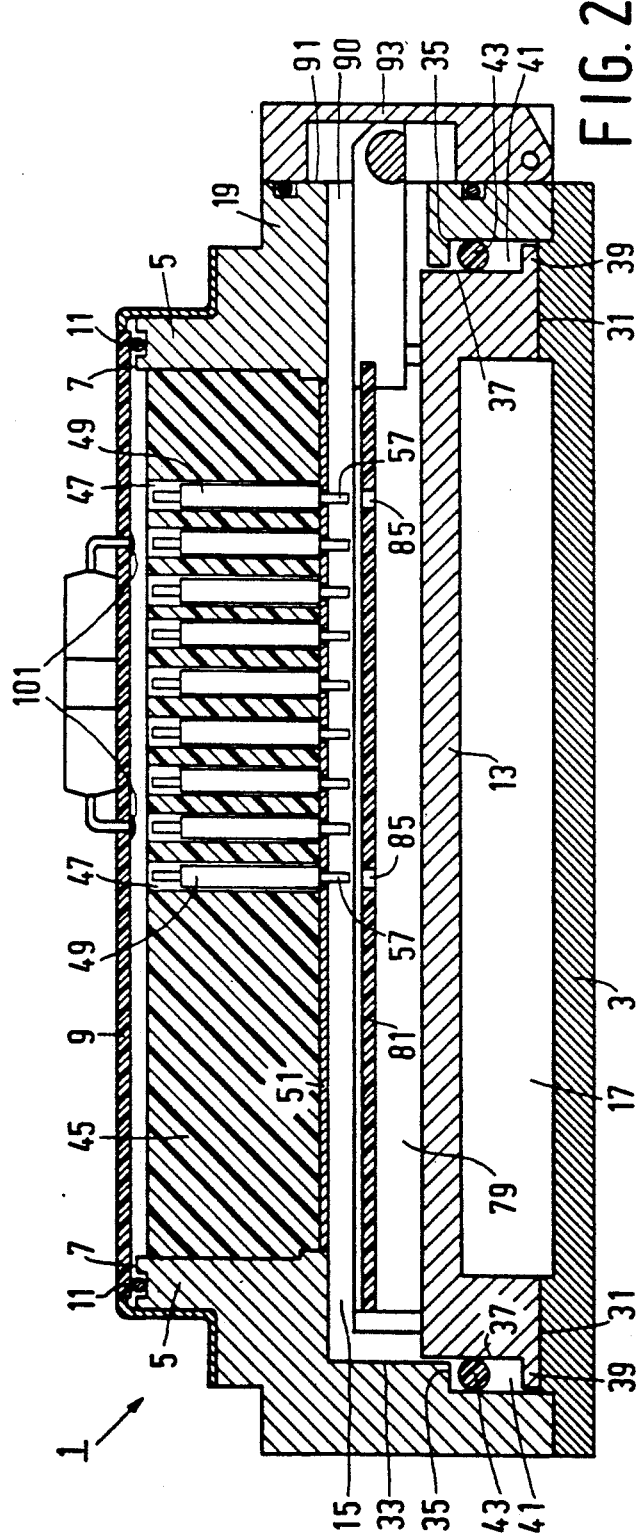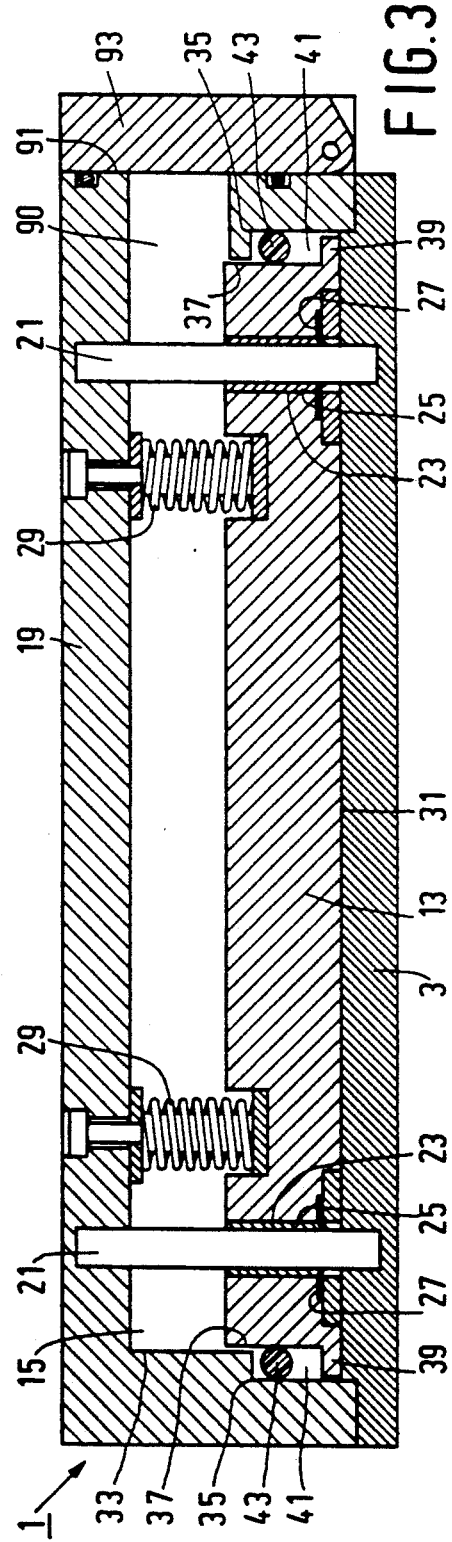

TEST DEVICE FOR ELECTRIC CIRCUITS ON BOARDS

BACKGROUND OF THE INVENTION

The invention relates to a device for testing electric circuits provided on boards and components of electric circuits provided on boards, in which device during operation a board comprising electric components to be tested lies fixedly against a support of the device as a result of an underpressure in a first chamber, and a contact plate which is movable in a direction transverse to the board is in a position in which the board is electrically connected to a test unit of the device as a result of a pressure difference between the first chamber and a second chamber.

A device of the kind mentioned in the opening paragraph known from U.S. Pat. No. 4,115,735 is provided with a first and a second contact plate, the first contact plate being positioned between the support and the second contact plate. Both contact plates are provided with a set of test probes which extend in a direction transverse to the board to be tested. Openings are provided in the first contact plate in which the test probes of the second contact plate can be shifted. In the known device, the first chamber is situated between the board and the first contact plate, while the second chamber is situated between the two contact plates. When an underpressure is provided in the first chamber only, the test probes of the first contact plate only come into contact with the board, so that components of the circuit can be tested. When an underpressure is applied in both chambers, all test probes come into contact with the board and the operation of the entire circuit can be tested.

A disadvantage of the known device is that the test probes of the second contact plate must fit accurately in the openings of the first contact plate in order to achieve a satisfactory sealing between the two chambers. This leads to comparatively high manufacturing costs. A further disadvantage of the known device is that the contact plates are difficult to replace, so that the known device is in principle only suitable for testing one type of board. Finally, when an underpressure is applied in the first chamber or in both chambers of the known device, a number of test probes is brought into contact with the board while the underpressure simultaneously secures the board on the support. It is possible for the test probes to come into contact with the board too soon then, so that the board will not lie correctly on the support or will even be damaged.

SUMMARY OF THE INVENTION

The invention has for its object to provide a device of the kind mentioned in the opening paragraph with which the disadvantages listed above can be avoided.

According to the invention, the contact plate is exchangeably provided on a partition wall which hermetically seals off the first chamber from the second chamber and which is movable under the influence of a pressure difference between the two chambers after a predetermined hold-down force between the board and the support has been obtained.

A simple and effective sealing between the two chambers is obtained through the use of a partition wall with an exchangeable contact plate, while different types of board can be tested in that a contact plate is provided on the partition wall which is adapted to the board to be tested.

A particular embodiment of a device according to the invention includes a set of test probes extending in a direction perpendicular to the board, a subset of test probes from this set uniqued for the board under test being in contact with a combination of contact points of the board corresponding to the subset during operation after moving of the contact plate. Many types of electric circuits can be tested in that the device is provided with a large number of test probes.

A further embodiment of a device according to the invention, which provides a simple and effective arrangement of the test probes in the device, comprises test probes in a grid arrangement of bores which extend in a direction transverse to the board in a matrix plate between the support and the contact plate, each test probe being movable in the relevant bore by means of the contact plate, while each test probe has at least one test pin which is movable relative to the test probe by means of the contact plate. The arrangement of the test probes in such a basically simple matrix plate with a fixed pitch and the arrangement of the contact points on each board to be tested at a mutual spacing which is equal to or a multiple of the said pitch, in addition, lead to spatial distributions of test probes and contact points, respectively, which can be readily coordinated with one another.

In a yet a further embodiment of a device according to the invention, which provides a constructionally simple and effective electric connection between the contact plate and the test unit of the device, the device includes a set of connection probes extending in a direction perpendicular to the contact plate and fixed in bores of a connection plate extending parallel to the contact plate, which connection probes are electrically connected to the test unit of the device, a subset of the connection probes being in contact with a combination of contact points of the contact plate corresponding to the said subset during operation after moving of the contact plate.

A special embodiment of a device according to the invention, which provides a simple and practical construction of the contact plate, is one where the contact plate is provided with a printed circuit by means of which a first set of contact points of the contact plate, which are in contact with the connection probes after moving of the contact plate, is electrically connected to a second set of contact points of the contact plate, which are in contact with test probes after moving of the contact plate. In this construction the contact plate is exchangeable by comparatively simple means.

A further embodiment of a device according to the invention, in which a satisfactory hold-down force between the board to be tested and the support is effectively achieved during operation prior to a movement of the contact plate, is characterized in that equal underpressures can be set simultaneously in the first chamber and in the second chamber. Setting of the same underpressures in both chambers renders it possible for the board to be held down on the support by suction while the partition wall with the contact plate remains in a position in which there is no contact between the board and the test probes.

A still further embodiment of a device according to the invention, in which the electric connections between the test probes and the test unit can be checked in a simple manner, is characterized in that a pressure can be set in the second chamber which is higher than an ambient pressure surrounding the device. The provision of an overpressure in the second chamber renders it possible to put the contact plate in a position in which the contact plate is in contact with the test probes and the connection probes without a panel being provided on the support. The test probes are thus accessible for an electrical resistance measurement to check the said electric connections.

BRIEF DESCRIPTION OF THE DRAWING

The invention will be explained in more detail below with reference to the drawing in which:

FIG. 2 shows a cross-section of the device taken on the line II—II in FIG. 1,

FIG. 3 shows a cross-section of the device taken on the line III—III in FIG. 1,

DESCRIPTION OF THE PREFERRED EMBODIMENT

Figure 1:
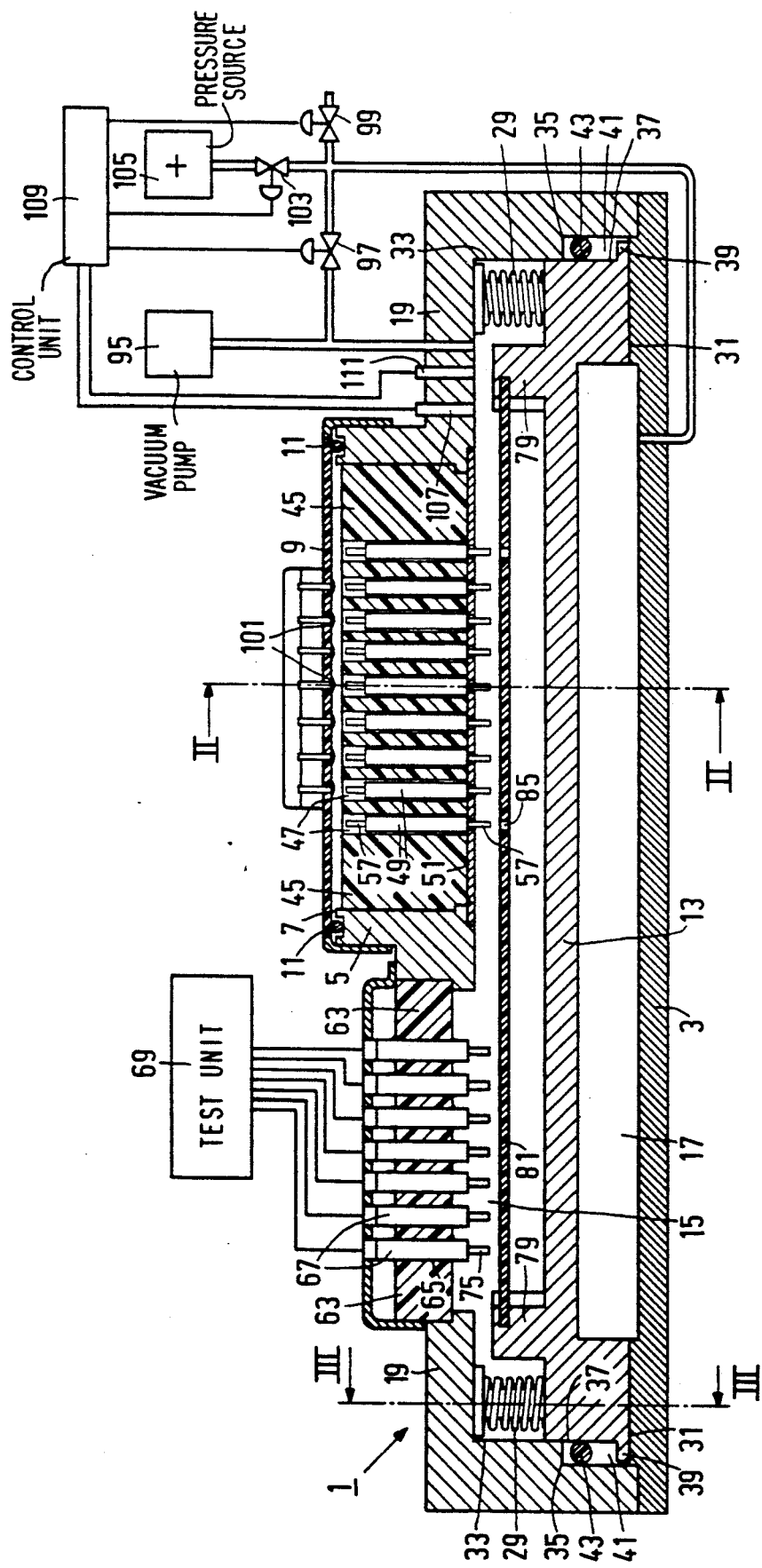
FIG. 1 shows a longitudinal section of a device according to the invention.

The device illustrated in FIGS. 1–6 comprises a rectangular metal holder 1 fastened to a rectangular metal base plate 3. The holder 1 further comprises a rectangular upright wall 5 with a support frame 7 on which a board 9 with electric circuits to be tested can be accurately positioned relative to the holder 1. The board 9 in that case lies with its edges on a rubber gasket 11 attached to the support frame 7.

In the holder 1 there is a metal partition wall 13 extending parallel to the board 9 and dividing the space inside the holder 1 into a first chamber 15 between the board 9 and the partition wall 13 and a second chamber 17 between the partition wall 13 and the base plate 3, as is shown in FIGS. 1 and 2. A number of round guide pins 21 (see FIG. 3) positioned perpendicular to the board 9 is fixed between the base plate 3 and a horizontal wall 19 of the holder 1. A same number of bores 23 is provided in the partition wall 13, in which bores guide bushes 25 are fastened, enclosing the guide pins 21 concentrically with little clearance. Furthermore, the partition wall 13 is provided with flat sealing rings 27 at the area of the bores 23, which rings bear on the guide pins 21 with their inside edges, so that a gas leak along the guide pins 21 in the case of a pressure difference between the two chambers 15, 17 is prevented. The partition wall 13 is thus movable in a direction transverse to the board 9 along the guide pins 21.

A number of pre-tensioned helical springs 29 is arranged between the partition wall 13 and the wall 19, under the influence of which the partition wall 13 lies against stops 31 provided on the base plate 3 if the pressures in the chambers 15, 17 are the same (see FIGS. 1 and 3).

It can be seen in FIGS. 1 and 2 that the holder 1 has vertical inside walls 33 which are each provided with a stepped profile 35 extending parallel to the board 9. As can be further seen in FIGS. 1 and 2, the partition wall 13 has a projecting rim 39 extending parallel to the board 9 on each lateral surface 37. The stepped profiles 35 and the projecting rims 39 enclose a frame-shaped chamber 41 near the lateral surfaces 37 of the partition wall 13. A sealing ring 43 present inside the chamber 41 is compressed between the inside walls 33 of the holder 1 and the lateral surfaces 37 of the partition wall 13, so that the first chamber 15 is hermetically sealed from the second chamber 17. The chamber 41 is sufficiently spacious in a direction transverse to the board 9 such that the sealing ring 43 can roll without slipping between the inside walls 33 and the lateral surfaces 37 when the partition wall 13 is moved.

Inside the upright wall 5 of the holder 1 is provided a matrix plate 45 of epoxy glass in which a large number of bores 47 is present in a grid pattern, which bores 47 extend in a direction transverse to the board 9. The bores 47 have a constant pitch. A movable copper test probe 49 is present in each bore 47, the test probes 49 resting against a horizontal support plate 51 with their ends facing the partition wall 13 when the pressures in the chambers 15, 17 are the same.

Figure 4:
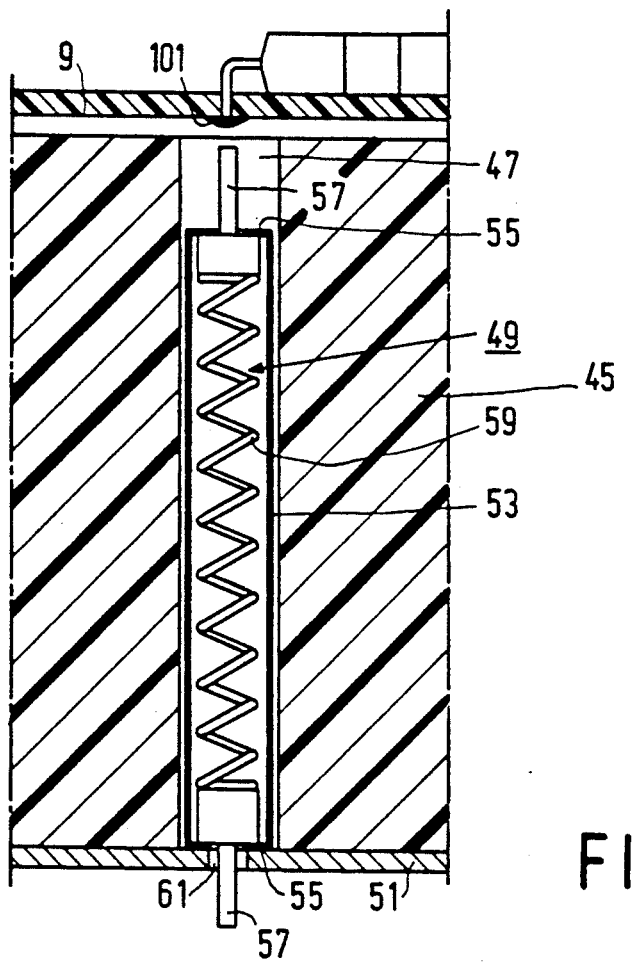
FIG. 4 shows in detail a test probe of the device as shown in FIG. 1.

FIG. 4 shows one of the test probes 49 in detail. Each test probe 49 comprises a tube 53 which is given a flanged rim 55 at either end. A copper pin 57 can slide in the tube 53 near each of its two ends. In a situation shown in FIG. 4, both pins 57 lie against the respective rims 55 of the tube 53 under pre-tension of a helical spring 59 of beryllium copper positioned between the pins 57, while the test probe 49 lies against the support plate 51 with its rim 55 facing the partition wall 13, the bottom pin 57 projecting through an opening 61 provided in the support plate 51.

Figure 5:
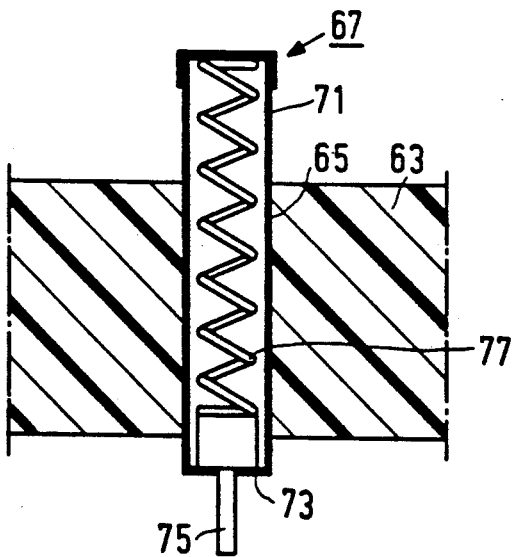
FIG. 5 shows in detail a connection probe of the device as shown in FIG. 1.
Figure 6:
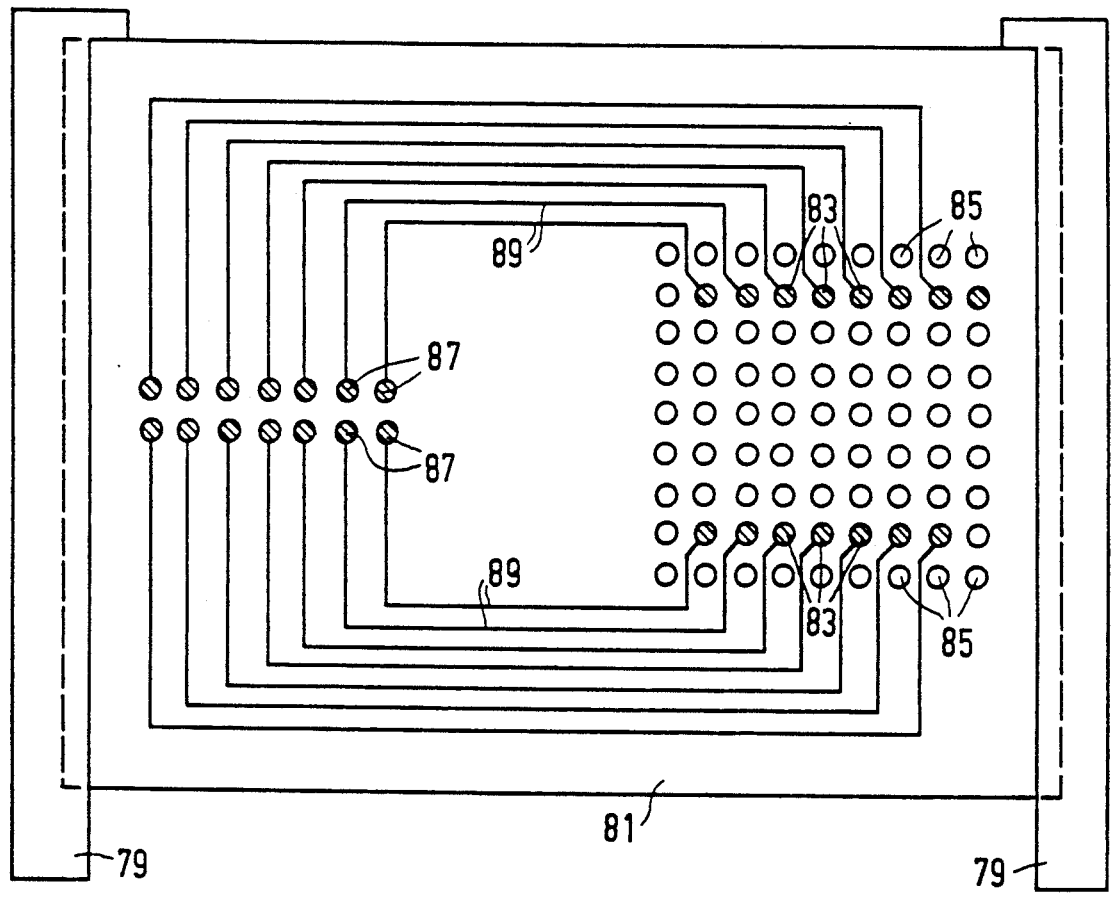
FIG. 6 shows a plan view of a contact plate of the device according to FIG. 1.

As can be seen in FIG. 1, a connection plate 63 made of an electrically insulating material is provided in the horizontal wall 19 of the holder 1 at some distance from and next to the matrix plate 45. Bores 65 extending in a direction transverse to the board 9 are provided in a grid pattern with constant pitch in the connection plate 63, as is the case in the matrix plate 45. A copper connection probe 67 is fastened in each of the bores 65 and electrically connected to an electronic test unit 69 of the device, indicated diagrammatically only in FIG. 1, by means of an end facing away from the partition wall 13. FIG. 5 shows one of the connection probes 67 in detail. Each connection probe 67 comprises a copper tube 71 which is provided with a flanged rim 73 at an end facing the partition wall 13. A copper pin 75 can slide in the tube 71 near the end of the tube 71 provided with the flanged rim 73. The pin 75 rests against the rim 73 under pre-tension of a helical spring 77 provided in the tube 71 when the pressures in the chambers 15, 17 are the same.

FIG. 1 shows that a side of the partition wall 13 facing the board 9 carries two parallel straight guide rails 79 which each extend near a lateral surface 37 of the partition wall 13 over the entire width of the partition wall 13. The guide rails 79 support a contact plate 81 which corresponds to the type of board 9 which is to be tested by means of the device. A portion of the contact plate 81 lying opposite the matrix plate 45 comprises a first set of electric contact points 83 and openings 85 in the contact plate 81, as is shown diagrammatically in FIG. 6. The distance between adjacent contact points 83 and openings 85 is equal to the pitch of the test probes 49 in the matrix plate 45, the number of contact points 83 and openings 85 together being equal to the number of test probes 49. A portion of the contact plate 81 lying opposite the connection plate 63 comprises a second set of electric contact points 87, as is diagrammatically shown in FIG. 6. The distance between adjacent contact points 87 is equal to the pitch of the connection probes 67 of the connection plate 63, and the number of contact points 87 is equal to the number of connection probes 67. Each of the contact points 83 of the first set is electrically connected to one of the contact points 87 of the second set by means of a printed circuit 89 of the contact plate 81, which is diagrammatically shown in FIG. 6.

Near an end of the guide rails 79 there is, as is shown in FIG. 2, an opening 90 in a side wall 91 of the holder 1. The opening 90 is enclosed by removable cover 93. The contact plate 81 can be removed from the partition wall 13 in that the contact plate 81 is passed along the guide rails 79 through the opening 90. The cover 93 is provided with means, not shown in the Figure in any detail, by which the contact plate 81 is locked in an accurate position relative to the matrix plate 45 and the connection plate 63 when the cover 93 is closed after the contact plate 81 has been provided on the partition wall 13.

As is diagrammatically shown in FIG. 1, the first chamber 15 is connected to a vacuum pump 95. The second chamber 17 is also connected to the vacuum pump 95 through a first electrically operated valve 97. After a board 9 has been laid on the support 7, an underpressure can be generated in both chambers 15, 17 simultaneously by the vacuum pump 95 when the valve 97 is opened. The board 9 is thus pressed on the support 7 by the pressure difference between ambient atmosphere of the surrounding of the device and the two chambers 15, 17, a satisfactory sealing between the board 9 and the support 7 being obtained through the gasket 11. During the vacuum attachment of the board 9, the partition wall 13 with the contact plate 81 remains in the position drawn in FIG. 1.

A second electrically operated valve 99, furthermore, which is situated between the second chamber 17 and the ambient atmosphere of the exterior of the device, is closed during the vacuum attachment of the board 9. After the board 9 has been held down by vacuum, the valve 97 is first closed and the valve 99 is subsequently opened, so that a pressure is built up in the second chamber 17 which is equal to the ambient pressure surrounding the device, an underpressure being maintained in the first chamber 15. Owing to the pressure difference between the first chamber 15 and the second chamber 17, the partition wall 13 with the contact plate 81 is moved along the guide pins 21 in the direction of the board 9. During this a number of test probes 49, which come into contact with the contact points 83 of the contact plate 81 during the movement of the partition wall 13, are pressed against electric test contacts 101 (see FIG. 4) of the board 9 along the bores 47 of the matrix plate 45, during which a sufficient contact force between the contact plate 81 on the one hand and the board 9 and the relevant test probes 49 on the other hand is obtained through compression of the helical springs 59 by the corresponding pins 57. The remaining, non-activated test probes 49 remain in the position drawn in FIG. 5 during the movement of the partition wall 13, the pins 57 of the relevant test probes 49 facing the partition wall 13 projecting into the openings 85 of the contact plate 81. In addition, the contact points 87 of the contact plate 81 come into contact with the connection probes 67 of the connection plate 63 during the movement of the partition wall 13. During this, compression of the helical springs 77 by the corresponding pins 75 ensures a sufficient contact force between the connection probes 67 and the contact plate 81.

The movement of the partition wall 13 in the manner described above leads to an electric connection between the test contacts 101 of the board 9 under test and the electronic test unit 69, after which the test proper of the board 9 by means of the test unit 69 can be carried out. For each panel 9 to be tested, a contact plate 81 unique for this type of panel is used here, comprising a set of contact points 83 and openings 85 which corresponds to the set of test contacts 101 of the relevant type of board 9.

After the test of the board 9 has been completed, the vacuum pump 95 is switched off and the first valve 97 is opened, so that the pressure in the first chamber 15 becomes equal to the ambient pressure. The partition wall 13 with the contact plate 81 is then moved along the guide pins 21 against the stops 31 under the force of the helical springs 29, upon which the position shown in FIG. 1 is reached again and the board 9 can be removed from the support 7.

As is further shown in FIG. 1, the second chamber 17 is connected to a pressure source 105 through a third electrically operated valve 103. The valve 103 is closed during the operational phases of the device described above. After the board 9 has been removed from the support 7, a pressure can be applied in the second chamber 17 which is higher than the ambient presure prevalent in the first chamber 15 in that the valves 97 and 99 are closed and the valve 103 is opened. The pressure difference between the two chambers 15 and 17 moves the partition wall 13 towards the support 7, during which the contact plate 81 shifts a number of test probes 49 in the matrix plate 45 and the connection probes 67 come into contact with the contact points 87 of the contact plate 81. In this position of the device, the electrical connection between the test probes 49 shifted in the matrix plate 45 and the test unit 69 can be checked by means of an electrical resistance measurement. After such a measurement has been carried out, the valve 103 is closed and the valves 97 and 99 are opened again, so that the pressure in both chambers 15 and 17 is equalized and the partition wall 13 returns to the stops 31.

FIG. 1 also diagrammatically shows a pressure sensor 107 of a type known per se, which is in the wall 19 of the holder 1. The pressure sensor 107 measures the pressure in the first chamber 15 and transmits a test signal to a control unit 109 which controls the valves 97, 99 and 103 as well as the vacuum pump 95. After a board 9 has been laid on the support 7, the control unit 109 opens the valve 97 and closes the valves 99 and 103, after which the vacuum pump 95 is switched on. If the pressure measured by the pressure sensor 107 passes below a limit valve during the vacuum attachment of the panel 9, the control unit 109 closes the valve 97 and then opens the valve 99, so that the contact plate 81 is moved. The movement of the contact plate 81 is measured by an inductive displacement sensor 111 of a type known per se which also transmits a test signal to the control unit 109. When the contact plate 81 has come close enough to the board 9, the test unit 69 is started by the control unit 109. After the test has been completed, finally, the control unit 109 switches off the vacuum pump 95 and opens the valve 97, so that then the partition wall 13 with the contact plate 81 returns to the stops 31.

It should be noted that the use of an underpressure in the chambers 15 and 17 of the holder 1, as described above, provides a simple and effective drive of the contact plate 81, while no further special means are required for securing the board 9 to be tested on the support 7. In fact, since first the board 9 is secured on the support 7 by an underpressure in both chambers 15, 17 and subsequently the partition wall 13 with the contact plate 81 is moved by a pressure difference between the two chambers 15, 17, the sequence of securing the board 9 and movement of the contact plate 81 is well-defined and the board 9 always bears securely on the support 7 during the test phase. The contact plate 81 may obviously also be moved by other driving means, such as, for example, electromagnetic or pneumatic driving means of a type known per se. In that case, however, separate means for securing the board 9 have to be used. These means should preferably also be used in a possible simplified embodiment of the device in which use is only made of an underpressure chamber in the holder between the board 9 and the contact plate 81. This is because in such an embodiment the vacuum attachment of the board 9 and the displacement of the contact plate 81 take place simultaneously, so that the board 9 can be knocked off the support 7 during 7 the displacement of the contact plate 81 if no further securing means are used.

It should further be noted that the grid arrangement of the test probes 49 in the matrix plate 45 is linked up with the location of the test contacts 101 on the board 9 under test. The arrangement of the test contacts 101 on the board 9 must be in accordance with the positions of the test probes 49 in the matrix plate 45. If, however, a different arrangement of the test contacts 101 should be neccessary for certain types of board 9, it is possible in principle to use a different matrix plate 45 with a corresponding arrangement of the test probes 49 and an adapted series of contact plates 81. The number of test probes 49 and the accompanying bores 47 is 13020 (124×105) in the embodiment described above, which is so great that all test contacts 101 of any board 9 to be tested by means of the device can come into contact with a corresponding portion of the test probes 49. The arrangement of the connection probes 67 in the connection plate 63 depends on the type of test unit 69 used in the device. If the use of a different type of test unit 69 should be necessary for certain types of boards 9, an adapted connection plate 63 should be used. The number of connection probes 67 and the accompanying bores 65 is 2448 in the embodiment described above.

It should also be noted that a simple arrangement of the matrix plate 45 is obtained through the use of the test probes 49 with pins 57 as described above. Obviously, test probes which are themselves of a simpler construction without resilient pins may alternatively be used. These simplified test probes are then in their entirety resiliently mounted in the matrix plate 45. This requires a different construction of the matrix plate 45.

It should finally be noted that the electric connection between the contact points 83 and the contact points 87 of the contact plate 81 may also be effected in a conventional manner by means of connecting wires at the side of the contact plate 81 remote from the board 9. A wiring provided in this way, however, is more susceptible to failure and may be damaged during insertion or removal of the contact plate 81 into/from the holder 1.

I claim:

1. A device for testing printed circuit board circuits and components comprising:
   a support for supporting a printed circuit board, said support having an interior chamber in fluid communication with said board;
   a partition wall for forming a first and a second chamber from said support interior chamber, said wall for hermetically sealing the first chamber from the second chamber, said wall being moveable to the first and second positions in reponse to a pressure differential between the first and second chambers after a predetermined printed circuit board holddown force between the board and the support has been obtained;
   vacuum means for creating said pressure differential and for creating said hold down force to secure the board to the support via a vacuum in said first chamber;
   test means coupled to the support for testing the components of said board; and
   contact plate means including a contact plate secured to said wall for displacement with said wall to said first and second positions, said plate being displaced to said first position in a direction transverse said board in response to said pressure differential, said plate being constructed to electrically connect the board to said means when in said first position.

2. A device as claimed in claim 1 wherein said test means includes a set of test probes secured to the support and extending in a direction perpendicular to the board, a first subset of the set of test probes being in contact with a plurality of contact points of the board corresponding to said first subset during operation after moving of the contact plate to the first position.

3. A device as claimed in claim 2 wherein the test means includes a connection plate having bores and secured to the support, a test unit and a second subset of the set of test probes forming connection probes extending in a direction perpendicular to the contact plate and fixed in the bores of the connection plate extending parallel to the contact plate, said subset of connection probes being electrically connected to the test unit, said subset of the connection probes being in contact with a plurality of contact points of the contact plate corresponding to the subset of connection probes during operation after moving of the contact plate to the first position.

4. A device as claimed in claim 3 wherein the contact plate is provided with a printed circuit by means of which a first set of contact points of the contact plate, which are in contact with the connection probes after moving of the contact plate, is electrically connected to a second set of contact points of the contact plate, which second set of contact points are in contact with the first subset of test probes after moving of the contact plate.

5. A device as claimed in claim 4 wherein equal underpressures are adjustably set simultaneously in the first chamber and in the second chamber.

6. A device as claimed in claim 5 wherein a pressure is adjustable in the second chamber to a value which is higher than ambient pressure surrounding the device.

7. A device as claimed in claim 3 wherein equal underpressures are adjustably set simultaneously in the first chamber and in the second chamber.

8. A device as claimed in claim 7 wherein a pressure is adjustable in the second chamber to a value which is higher than ambient pressure surrounding the device.

9. A device as claimed in claim 2 wherein the first subset of the test probes are in a grid arrangement of bores which extend in a direction transverse to the board in a matrix plate secured to the support between the support and the contact plate, each test probe of the first subset being movable in the relevant bore in response to movement of the contact plate, each test probe including at least one test pin which is movable relative to the test probe in response to displacement of the contact plate.

10. A device as claimed in claim 9 wherein the test means includes a connection plate secured to the support and having bores and a test unit, the test probes including a subset of connection probes extending in a direction perpendicular to the contact plate and fixed in the bores of the connection plate extending parallel to the contact plate, said connection probes being electrically connected to the test unit, said subset of connection probes being in contact with a plurality of contact points of the contact plate corresponding to the subset of connection probes during operation after moving of the contact plate to the first position.

11. A device as claimed in claim 10 wherein the contact plate is provided with a printed circuit by means of which a first set of contact points of the contact plate, which are in contact with the connection probes after moving of the contact plate, is electrically connected to a second set of contact points of the contact plate, which second set of contact points are in contact with the first subset of test probes after moving of the contact plate.

12. A device as claimed in claim 11 wherein equal underpressures are adjustably set simultaneously in the first chamber and in the second chamber.

13. A device as claimed in claim 12 wherein a pressure is adjustable in the second chamber to a value which is higher than ambient pressure surrounding the device.

14. A device as claimed in claim 11 having a pressure in the second chamber which is higher than ambient pressure surrounding the device.

15. A device as claimed in claim 1 wherein the test means includes a test unit, a set of test probes and a connection plate having bores and secured to the support parallel to the contact plate, said set of test probes including a subset of connection probes extending in a direction perpendicular to the contact plate and fixed in the bores of the connection plate, said connection probes being electrically connected to the test unit, the subset of connection probes being in contact with a plurality of contact points of the contact plate corresponding to the subset during operation after moving of the contact plate to the first position.

16. A device as claimed in claim 15 wherein the contact plate is provided with a printed circuit by means of which a first set of contact points of the contact plate, which are in contact with the connection probes after moving of the contact plate, is electrically connected to a second set of contact points of the contact plate, which second set of contact points are in contact with a second subset of the test probes after moving of the contact plate to the first position.

17. A device as claimed in claim 1 wherein equal underpressures are adjustably set simultaneously in the first chamber and in the second chamber.

18. A device as claimed in claim 1 having a pressure set in the second chamber which is higher than an ambient pressure surrounding the device.

19. The device of claim 1 wherein said contact plate means are releasably secured to said wall.

20. A device as claimed in claim 1 wherein the board is secured to the support by said pressure differential in a fixed position.

21. A device as claimed in claim 1 wherein the contact plate means includes means exchangeably securing the contact plate to said wall.

* * * * *